(12) United States Patent
Kasai et al.

(10) Patent No.: US 9,202,731 B2
(45) Date of Patent: Dec. 1, 2015

(54) LIQUID PROCESSING APPARATUS, LIQUID PROCESSING METHOD, AND RECORDING MEDIUM HAVING PROGRAM FOR EXECUTING LIQUID PROCESSING METHOD RECORDED THEREIN

(75) Inventors: Shigeru Kasai, Nirasaki (JP); Ayuta Suzuki, Nirasaki (JP); Ikuo Sawada, Nirasaki (JP); Naoki Shindo, Koshi (JP); Masatake Yoneda, Nirasaki (JP); Kazuhiro Ooya, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 273 days.

(21) Appl. No.: 13/334,406

(22) Filed: Dec. 22, 2011

(65) Prior Publication Data

US 2012/0160274 A1    Jun. 28, 2012

(30) Foreign Application Priority Data

Dec. 27, 2010  (JP) .................................. 2010-290973

(51) Int. Cl.
| | | |
|---|---|---|
| H01L 21/00 | (2006.01) | |
| H01L 21/67 | (2006.01) | |
| H01L 21/02 | (2006.01) | |

(52) U.S. Cl.
CPC .... H01L 21/67115 (2013.01); H01L 21/02052 (2013.01); H01L 21/67028 (2013.01); H01L 21/67051 (2013.01); *H01L 21/02057* (2013.01)

(58) Field of Classification Search
CPC ................... H01L 21/67051; H01L 21/67028; H01L 21/02052; H01L 21/67115; H01L 2021/60097

USPC .............. 134/19, 358, 35, 198; 427/521, 557
See application file for complete search history.

(56) References Cited

U.S. PATENT DOCUMENTS

| 4,678,536 A | * | 7/1987 | Murayama et al. ........... 117/108 |
| 5,029,245 A | * | 7/1991 | Keranen et al. ............... 250/205 |
| 5,030,319 A | * | 7/1991 | Nishino et al. .................. 216/87 |
| 6,068,002 A | * | 5/2000 | Kamikawa et al. ............ 134/66 |
| 6,239,038 B1 | * | 5/2001 | Wen .............................. 438/745 |
| 6,426,308 B1 | * | 7/2002 | Park et al. ..................... 438/785 |

(Continued)

FOREIGN PATENT DOCUMENTS

| JP | 09-038595 A | 2/1997 |
| JP | 11067681 A * | 3/1999 |

(Continued)

OTHER PUBLICATIONS

Optical Properties of Low-dimensional Materials, vol. 1, Ogawa et al., 1995, p. 256.*

(Continued)

*Primary Examiner* — Joesph L Perrin
*Assistant Examiner* — Kevin G Lee
(74) *Attorney, Agent, or Firm* — Abelman, Frayne & Schwab

(57) ABSTRACT

Disclosed is a liquid processing apparatus that processes a substrate with a processing liquid. The processing apparatus includes: a substrate holder configured to hold the substrate; a processing liquid supply unit configured to supply the processing liquid to the substrate held by the substrate holder; a rinsing liquid supply unit configured to supply a rinsing liquid to the substrate; and a light emitting element configured to emit light of a wavelength range, which is absorbed only by the substrate, and irradiate the emitted light to the substrate.

9 Claims, 9 Drawing Sheets

(56) References Cited

U.S. PATENT DOCUMENTS

| | | | |
|---|---|---|---|
| 6,955,178 B1* | 10/2005 | Kuzumoto et al. | 134/102.1 |
| 6,962,732 B2* | 11/2005 | Won et al. | 427/578 |
| 6,965,092 B2* | 11/2005 | Mahawili | 219/390 |
| 7,527,694 B2* | 5/2009 | Sundar | 118/729 |
| 8,192,053 B2* | 6/2012 | Owen et al. | 362/294 |
| 8,513,626 B2* | 8/2013 | Ramachandran et al. | 250/492.3 |
| 2006/0107976 A1* | 5/2006 | Boyers et al. | 134/94.1 |
| 2010/0192978 A1* | 8/2010 | Plavidal et al. | 134/19 |
| 2010/0267174 A1* | 10/2010 | Moffatt | 438/16 |

FOREIGN PATENT DOCUMENTS

| | | |
|---|---|---|
| JP | 2002-231688 A | 8/2002 |
| JP | 2003-347267 A | 12/2003 |
| JP | 2004200330 A * | 7/2004 |
| JP | 2006-332198 A | 12/2006 |
| TW | 200629009 A | 8/2006 |
| TW | 200847249 A | 12/2008 |

OTHER PUBLICATIONS

Tungsten-Halogen Lamps, Education in Microscopy and Digital Imaging, Zeiss-Campus.magnet.fsu.edu (available at http://web.archive.org/web/20081223034455/http://zeiss-campus.magnet.fsu.edu/articles/lightsources/tungstenhalogen.html) (dated Dec. 23, 2008).*

Machine translation of JP 2004-200330 A, dated Jul. 2004.*

Machine translation of JP 11067681 A, dated Mar. 1999.*

* cited by examiner

LIQUID PROCESSING APPARATUS, LIQUID PROCESSING METHOD, AND RECORDING MEDIUM HAVING PROGRAM FOR EXECUTING LIQUID PROCESSING METHOD RECORDED THEREIN

CROSS-REFERENCE TO RELATED APPLICATIONS

This application is based on and claims priority from Japanese Patent Application No. 2010-290973, filed on Dec. 27, 2010, with the Japanese Patent Office, the disclosure of which is incorporated herein in its entirety by reference.

TECHNICAL FIELD

The present disclosure relates to a liquid processing apparatus and a liquid processing method that process a substrate with a processing liquid, and a recording medium having a program for executing the liquid processing method recorded therein.

BACKGROUND

In a manufacturing process of a semiconductor device or a manufacturing process of a flat panel display (FPD), a process of supplying a processing liquid to various substrates such as a semiconductor wafer or a glass substrate to perform processing has been widely used. The process may include, for example, cleaning by various processing liquids, which is used to remove particles attached onto the surface of the substrate or a native oxide film formed by contacting the atmosphere.

As a liquid processing apparatus that performs the process such as the cleaning process of a substrate, an apparatus including, among others, a plurality of single wafer type liquid processing units and a transportation device is used. The transportation device carries in and out the substrate for the liquid processing units.

The liquid processing unit includes, for example, a rotation placement section, a processing liquid supply nozzle, and a rinsing liquid supply nozzle (see, for example, Japanese Patent Application Laid-Open No. H09-38595). The rotation placement section is rotatably installed while holding the substrate. The processing liquid supply nozzle supplies the processing liquid to the substrate and the rinsing liquid supply nozzle supplies the rinsing liquid to the substrate. The liquid processing unit holds the substrate such as the semiconductor wafer in the rotation placement section and performs the processing by supplying the processing liquid to, for example, the substrate surface while rotating the substrate. After the processing by the processing liquid, the rinsing liquid is supplied to the substrate surface while rotating the substrate to perform rinsing.

However, a liquid processing method in the liquid processing apparatus has the following problems.

For example, as the semiconductor device is miniaturized, a hole having a high aspect ratio which is a ratio of a depth to a diameter or a pattern having the high aspect ratio may be formed on the surfaces of various substrates such as the semiconductor wafer. There is a case where the substrate with the hole or pattern having the high aspect ratio is processed by a processing liquid and thereafter, the substrate is rinsed with rinsing liquid.

However, when the aspect ratio of the hole or pattern is high, even though the rinsing liquid is supplied to the substrate to which the processing liquid was previously supplied after the processing by the processing liquid, the processing liquid that remains in the hole or pattern cannot be easily substituted with the rinsing liquid. Therefore, after the rinsing, the processing liquid may remain in the hole or pattern. A rinsing time should be increased in order to prevent the processing liquid from being remained in the hole or pattern.

The above problems are not limited to the case where the substrate with the hole or pattern having the high aspect ratio formed on the surface thereof is processed by the processing liquid, and thereafter, rinsed. Even though the aspect ratio is not high, the processing liquid may be easily remained and the rinsing time may need to be increased. Accordingly, the problems are common ones that occur when various substrates with the hole or pattern formed on the surfaces thereof are processed by the processing liquid and thereafter, rinsed with rinsing liquid.

SUMMARY

An exemplary embodiment of the present disclosure provides a liquid processing apparatus that processes a substrate with a processing liquid, including: a substrate holder configured to hold the substrate; a processing liquid supply unit configured to supply the processing liquid to the substrate held by the substrate holder; a rinsing liquid supply unit configured to supply a rinsing liquid to the substrate; and a light emitting element configured to emit light of a wavelength range, which is absorbed only by the substrate, and irradiate the emitted light to the substrate. The substrate is configured to form a hole portion or a pattern on the surface of the substrate, and the light emitting element heats the processing liquid within the hole portion or the pattern by heating the substrate using the light of the wavelength range and as a result a diffusion coefficient of the heated processing liquid is increased to easily mix the heated processing liquid and the rinsing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
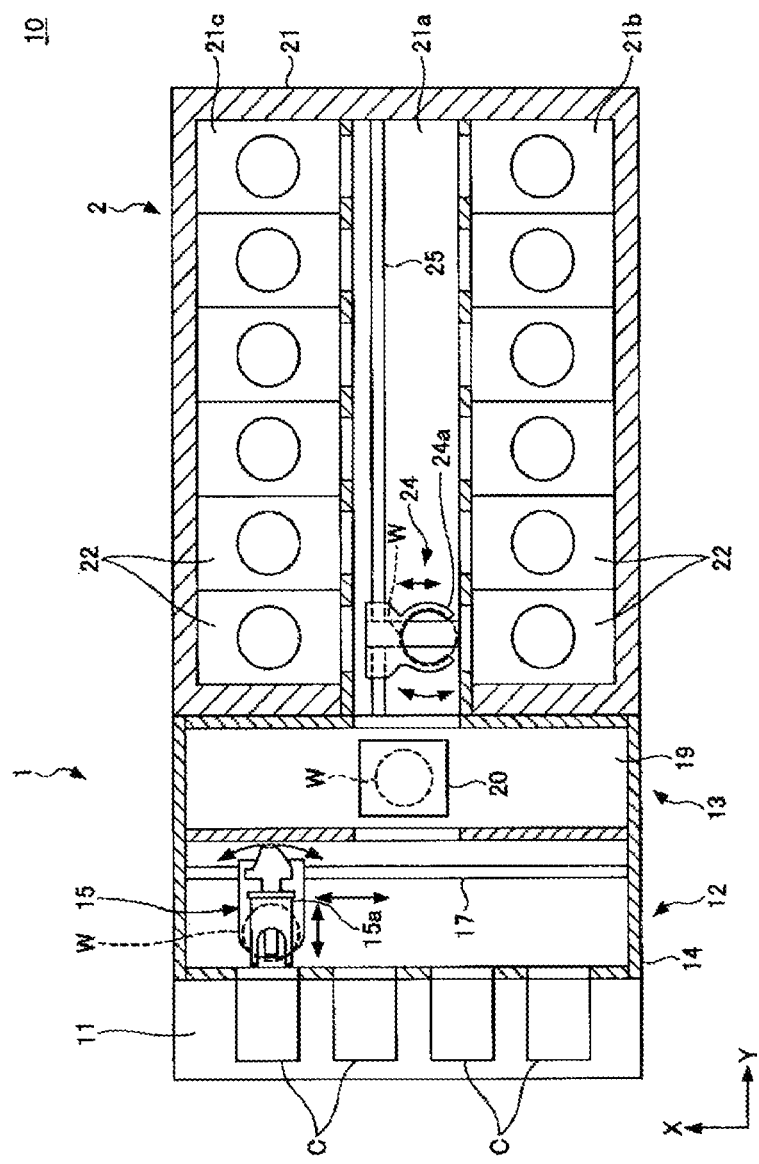
FIG. 1 is a plan view illustrating a schematic configuration of a liquid processing apparatus according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a liquid processing apparatus and a liquid processing method that can facilitate substitution of a processing liquid and rinsing liquid, and prevent the processing liquid from being remained on a substrate to decrease a processing time, when rinsing the substrate after processing the substrate with the processing liquid.

In order to solve the problems, the present disclosure features to seek after the technical means to be described below.

A first exemplary embodiment of the present disclosure provides a liquid processing apparatus that processes a substrate with a processing liquid, including: a substrate holder configured to hold the substrate; a processing liquid supply unit configured to supply the processing liquid to the substrate held by the substrate holder; a rinsing liquid supply unit configured to supply a rinsing liquid to the substrate; and a light emitting element configured to emit light of a wavelength range, which is absorbed only by the substrate, and irradiate the emitted light to the substrate. The substrate is configured to form a hole portion or a pattern on the surface of the substrate, and the light emitting element heats the processing liquid within the hole portion or the pattern by heating the substrate using the light of the wavelength range, and as a result, a diffusion coefficient of the heated processing liquid is increased to easily mix the heated processing liquid and the rinsing liquid.

In a first aspect of the first exemplary embodiment, the light emitting element irradiates the emitted light to the surface of the substrate having a pattern.

In a second aspect of the first exemplary embodiment, the liquid processing apparatus further comprises: a control unit configured to control the substrate holder, the processing liquid supply unit, the rinsing liquid supply unit, and the light emitting element. In particular, the control unit controls the processing liquid supply unit to supply the processing liquid to the substrate, and the rinsing liquid supply unit to supply the rinsing liquid to the substrate supplied with the processing liquid, and controls to dry the substrate supplied with the rinsing liquid. In particular, the control unit controls the light emitted by the light emitting element to be irradiated to the substrate during at least one period when the rinsing liquid is supplied to heat the substrate. Therefore, the processing liquid within a hole portion or a pattern formed on the surface of the substrate is heated, and as a result, a diffusion coefficient of the heated processing liquid is increased to easily mix the heated processing liquid and the rinsing liquid.

In a third aspect of the first exemplary embodiment, the controller controls the irradiation of the light from the light emitting element to begin after supplying the rinsing liquid for a predetermined of time when supplying the rinsing liquid to the substrate.

In a fourth aspect of the first exemplary embodiment, the substrate is a silicon substrate, and the light emitted by the light emitting element has a peak wavelength in the wavelength range of 400 nm to 1000 nm.

In a fifth aspect of the first exemplary embodiment, the liquid processing apparatus further comprises: an organic solvent supply unit configured to supply an organic solvent to the substrate. In particular, the control unit controls the organic solvent unit to supply the organic solvent to the substrate supplied with the rinsing liquid and controls to dry the substrate after removing the rinsing liquid with the supplied organic solvent. In particular, the control unit controls the light emitted by the light emitting elements to be irradiated to the substrate when supplying the organic solvent to the substrate.

In a sixth aspect of the first exemplary embodiment, the control unit controls the light emitted by the light emitting element to be irradiated to the substrate before supplying the processing liquid to the substrate.

A second exemplary embodiment of the present disclosure provides a liquid processing method processing a substrate with a processing liquid, including: supplying the processing liquid to a substrate held by a substrate holder using a processing liquid supply unit; supplying a rinsing liquid to the substrate supplied with the processing liquid using a rinsing liquid supply unit; drying the substrate supplied with the rinsing liquid; and irradiating light from a light emitting element which is absorbed only by the substrate onto the substrate during at least one period when the rinsing liquid is supplied.

In a first aspect of the second exemplary embodiment, convection is generate between the processing liquid and the rinsing liquid on the surface of the substrate in the rinsing liquid supplying process.

A third exemplary embodiment of the present disclosure provides a computer readable recording medium storing a computer executable program that, when executed, causes a computer to perform a liquid processing method comprising: supplying the processing liquid to a substrate held by a substrate holder using a processing liquid supply unit; supplying a rinsing liquid to the substrate supplied with the processing liquid using a rinsing liquid supply unit; drying the substrate supplied with the rinsing liquid; and irradiating light from a light emitting element which is absorbed only by the substrate onto the substrate during at least one period when the rinsing liquid is supplied.

In the second exemplary embodiments, the first aspect and the third aspect to six aspect of the first exemplary embodiment may be adopted. Further, the first aspect and the third aspect to sixth aspect may be appropriately combined with each other.

According to the exemplary embodiments of the present disclosure, substitution of a processing liquid and rinsing liquid can be facilitated, and the processing liquid can be prevented from being remained on a substrate to decrease a processing time, when rinsing the substrate after processing the substrate with the processing liquid.

Exemplary embodiments of the present disclosure will be described with reference to the accompanying drawings. Herein, the exemplary embodiments are applied to a liquid processing apparatus that cleans the surface of a semiconductor wafer (hereinafter, 'wafer W').

First Exemplary Embodiment

First, referring to FIG. 1, a schematic configuration of a liquid processing apparatus according to a first exemplary embodiment of the present disclosure will be described.

FIG. 1 is a plan view illustrating a schematic configuration of a liquid processing apparatus according to a first exemplary embodiment.

The liquid processing apparatus 10 includes a carry-in/out station (substrate carrying-in/out unit) 1 having a wafer carrier C receiving a plurality of wafers W and carrying in/out wafers W, and a processing station (liquid processing unit) 2 for cleaning wafers W. Carry-in/out station 1 and processing station 2 are provided adjacent to each other.

Carry-in/out station 1 includes a carrier placing unit 11, a transportation unit 12, a delivery unit 13, and a housing 14. Four (4) wafer carriers C receiving plural wafers W horizontally are placed in carrier placing unit 11. Transportation unit 12 transports wafers W. Delivery unit 13 delivers wafers W. Housing 14 accommodates transportation unit 12 and delivery unit 13.

Transportation unit 12 includes a transportation mechanism 15 which includes a wafer holding arm 15a holding wafer W and a mechanism moving wafer holding arm 15a forward and backward directions. Transportation mechanism 15 includes a mechanism moving wafers W along a horizontal guide 17 that extends in an x-direction which is an arrangement direction of wafer carrier C, a mechanism moving wafers W along a vertical guide (not shown) installed vertically, and a mechanism rotating wafers W on a horizontal plane. Wafers W are transported between wafer carrier C and delivery unit 13 by transportation mechanism 15.

Delivery unit 13 includes a delivery rack 20 including a plurality of placing sections where wafers W can be placed. Wafers W are delivered between delivery unit 13 and processing station 2 through delivery rack 20.

Processing station 2 includes a housing 21 having a rectangular parallelepiped shape. In processing station 2, housing 21 has a transportation chamber 21a constituting a transportation path that extends in a y-direction perpendicular to the x-direction which is the arrangement direction of wafer carrier C at the upper center thereof and two unit chambers 21b and 21c provided at both sides of transportation chamber 21a. Six (6) liquid processing units 22 are arranged horizontally along transportation chamber 21a in each of unit chambers 21b and 21c. That is, a total of twelve (12) liquid processing units 22 are arranged horizontally along transportation chamber 21a in each of unit chamber 21b and 21c.

A transportation mechanism 24 is installed in transportation chamber 21a. Transportation mechanism 24 includes a wafer holding arm 24a holding wafer W and a mechanism moving wafer holding arm 24a forward and backward directions. Transportation mechanism 24 includes a mechanism moving wafers W along a horizontal guide 25 installed in transportation chamber 21a in the y-direction, a mechanism moving wafers W on a vertical guide (not shown) installed vertically, and a mechanism rotating wafers W on the horizontal plane. Wafers W are carried in/out with respect to each liquid processing unit 22 by transportation mechanism 24.

Figure 2:
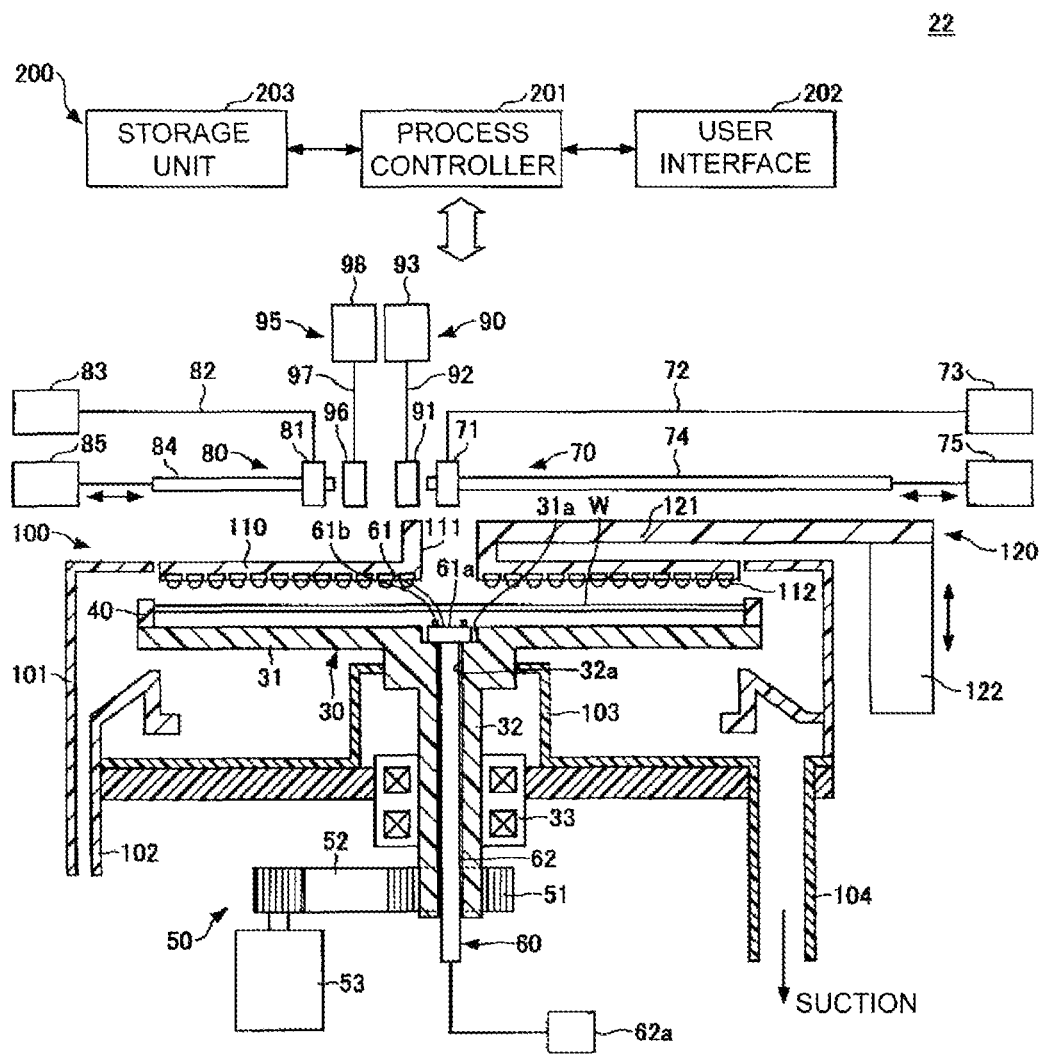
FIG. 2 is a cross-sectional view illustrating a schematic configuration of a liquid processing unit.
Figure 3:
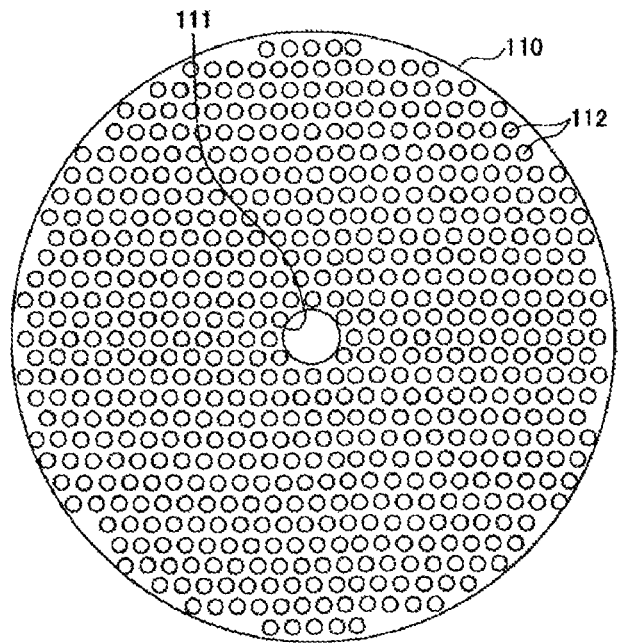
FIG. 3 is a bottom view of a top plate provided in the liquid processing unit.

Next, referring to FIGS. 2 and 3, liquid processing unit 22 mounted on the liquid processing apparatus according to the exemplary embodiment will be described. FIG. 2 is a cross-sectional view illustrating a schematic configuration of a liquid processing unit 22. FIG. 3 is a bottom view of a top plate provided in the liquid processing unit 22.

Liquid processing unit 22 includes a rotation plate 30, a holding member 40, a rotation driver 50, a substrate elevating member 60, a processing liquid supply mechanism 70, a rinsing liquid supply mechanism 80, an organic solvent supply mechanism 90, a dry gas supply mechanism 95, an exhaust/drainage unit (cup) 100, a top plate 110, an elevation mechanism 120, and a control unit 200.

Rotation plate 30 includes a base plate 31 and a rotational shaft 32. Base plate 31 is installed horizontally and has a circular hole 31a at the center thereof. Rotational shaft 32 is installed to extend downward from base plate 31 and has a cylindrical shape with a hole 32a at the center thereof.

Holding member 40 is rotatably installed on base plate 31 and holds wafers W at the end of wafers W.

Rotation plate 30 and holding member 40 correspond to a substrate holder in the exemplary embodiment of the present disclosure.

Rotation driver 50 includes a pulley 51, a driving belt 52, and a motor 53. Pulley 51 is placed outside the peripheral edge in a lower part of rotational shaft 32. Driving belt 52 is wound around pulley 51. Motor 53 is connected to driving belt 52 and rotates rotational shaft 32 through pulley 51 by delivering rotation driving force to driving belt 52. That is, rotation driver 50 rotates base plate 31 and holding member 40 by rotating rotational shaft 32. A bearing 33 is placed outside the peripheral edge of rotational shaft 32.

Substrate elevating member 60 is elevatably installed in hole 31a of base plate 31 and hole 32a of rotational shaft 32 and includes a lift pin plate 61 and a lift shaft 62. Lift shaft 62 extends downward from lift pin plate 61. Lift pin plate 61 includes plural, for example, three (3) lift pins 61b on the periphery of a top surface 61a thereof. A cylinder mechanism 62a is connected to a lower end of lift shaft 62 and substrate elevating member 60 is elevated by cylinder mechanism 62a, such that wafers W are elevated to be loaded and unloaded to and from transportation mechanism 24.

Processing liquid supply mechanism 70 includes a processing liquid supply nozzle 71, a processing liquid supply pipe 72, and a processing liquid supply source 73. Processing liquid supply nozzle 71 is connected to processing liquid supply source 73 through processing liquid supply pipe 72. Processing liquid supply nozzle 71 supplies a processing liquid supplied from processing liquid supply source 73 through processing liquid supply pipe 72, to wafers W. Processing liquid supply nozzle 71 is held by a nozzle arm 74. Nozzle arm 74 is movably driven by a driving mechanism 75. Processing liquid supply nozzle 71 is movable between a supplying position at the upper center of wafer W and a retracting position by moving nozzle arm 74 with driving mechanism 75. As the processing liquid, for example, diluted hydrofluoric acid (DHF) or ammonia hydrogen peroxide (SC1) may be used.

Processing liquid supply mechanism 70 corresponds to a processing liquid supply unit in the exemplary embodiment of the present disclosure.

Rinsing liquid supply mechanism 80 includes a rinsing liquid supply nozzle 81, a rinsing liquid supply pipe 82, and a rinsing liquid supply source 83. Rinsing liquid supply nozzle 81 is connected to rinsing liquid supply source 83 through rinsing liquid supply pipe 82. Rinsing liquid supply nozzle 81 supplies rinsing liquid supplied from rinsing liquid supply source 83 through rinsing liquid supply pipe 82, to wafers W. Rinsing supply nozzle 81 is held by a nozzle arm 84. Nozzle arm 84 is movably driven by a driving mechanism 85. Rinsing liquid supply nozzle 81 is movable between the supplying position at the upper center of wafer W and the retracting position by moving nozzle arm 84 by using driving mechanism 85. As the rinsing liquid, for example, deionized water may be used.

Rinsing liquid supply mechanism 80 corresponds to a rinsing liquid supply unit in the exemplary embodiment of the present disclosure.

Organic solvent supply mechanism 90 includes an organic solvent supply nozzle 91, an organic solvent supply pipe 92, and an organic solvent supply source 93. Organic solvent supply nozzle 91 is connected to organic solvent supply source 93 through organic solvent supply pipe 92. Organic solvent supply nozzle 91 supplies an organic solvent supplied from organic solvent supply source 93 through organic solvent supply pipe 92, to wafers W. Organic solvent supply nozzle 91 is movable between the supplying position at the upper center of wafer W and the retracting position by moving the nozzle arm (not shown) with the driving mechanism (not shown), similarly to processing liquid supply nozzle 71. As the organic solvent, for example, various organic solvents having surface tension smaller than that of the rinsing liquid, such as isopropyl alcohol (IPA) and hydro fluoro ether (HFE) may be used.

Organic solvent supply mechanism 90 corresponds to an organic solvent supply unit in the exemplary embodiment of the present disclosure.

Dry gas supply mechanism 95 includes a dry gas supply nozzle 96, a dry gas supply pipe 97, and a dry gas supply source 98. Dry gas supply nozzle 96 is connected to dry gas supply source 98 through dry gas supply pipe 97. Dry gas supply nozzle 96 supplies dry gas supplied from dry gas supply source 98 through dry gas supply pipe 97, to wafers W. Dry gas supply nozzle 96 is movable between the supplying position at the upper center of wafer W and the retracting position by moving the nozzle arm (not shown) with the driving mechanism (not shown), similarly to processing liquid supply nozzle 71. As the dry gas, for example, nitrogen ($N_2$) gas may be used.

Exhaust/drainage unit (cup) 100 includes a drainage cup 101, a drainage pipe 102, an exhaust cup 103, and an exhaust pipe 104. Exhaust/drainage unit (cup) 100 has an opening on the top surface thereof. Exhaust/drainage unit (cup) 100 is used to recover gas and liquid discharged from a space surrounded by rotation plate 30 and top plate 110.

Drainage cup 101 receives the processing liquid, the rinsing liquid, and the organic solvent. Drainage pipe 102 is connected to the outermost portion of the bottom of drainage cup 101 and discharges the processing liquid received by drainage cup 101. Exhaust cup 103 is installed to be in communication with drainage cup 101 in a location outside or below drainage cup 101. Exhaust pipe 104 is connected to the outermost portion of the bottom of exhaust cup 103 and exhausts gas such as the nitrogen gas in exhaust cup 103.

Top plate 110 is elevatable and is installed to close the opening formed on the top surface of exhaust/drainage unit (cup) 100 while top plate 110 is in a descending state. Top plate 110 is installed to cover wafer W held by holding member 40 from above when closing the opening formed on the top surface of exhaust/drainage unit (cup) 100.

Elevation mechanism 120 includes an arm 121 and an elevation driver 122. Elevation driver 122 is installed outside exhaust/drainage unit (cup) 100 and is movable upward and downward directions. Arm 121 is installed to connect top plate 110 and elevation driver 122. That is, elevation mechanism 120 elevates top plate 110 by elevation driver 122 through arm 121.

Top plate 110 has an opening portion 111 penetrating top plate 110 at the center thereof. Opening portion 111 is used to supply, to wafer W, the processing liquid, the rinsing liquid, the organic solvent, and the dry gas by processing liquid supply nozzle 71, rinsing liquid supply nozzle 81, organic solvent supplying nozzle 91, and dry gas supplying nozzle 96, respectively, from above top plate 110.

Processing liquid supply nozzle 71, rinsing liquid supply nozzle 81, organic solvent supply nozzle 91, and dry gas supply nozzle 96 may be installed separately from top plate 110 or integrally with top plate 110, as described above. When processing liquid supply nozzle 71, rinsing liquid supply nozzle 81, organic solvent supply nozzle 91, and dry gas supply nozzle 96 are installed integrally with top plate 110, the nozzle arm and the driving mechanism may be omitted from each nozzle.

A plurality of light emitting elements 112 are installed on the bottom surface of top plate 110. Light emitting elements 112 emit light having a wavelength range which only wafer W absorbs and irradiate the emitted light to wafer W. As shown in FIGS. 2 and 3, light emitting elements 112 may be arranged on the bottom surface of top plate 110, for example, substantially without a gap at regular intervals.

As light emitting elements 112, for example, a plurality of light emitting diodes (LEDs) or a plurality of semiconductor lasers may be used. The reason therefore is that the LED or the semiconductor laser easily emits light of a wavelength range which is not absorbed by the processing liquid or the rinsing liquid but absorbed only by wafer W because light emitted by the light emitting diode (LED) or the semiconductor laser has a peak wavelength in a predetermined wavelength range.

The LEDs are used as light emitting elements 112 to shorten the time until the temperature of wafer W increases to be stable after the LEDs are turned ON. The LED has high luminous efficiency. Accordingly, the LEDs are used as light emitting elements 112 to reduce power consumption.

When a silicon wafer is used as wafer W, the light emitted by light emitting element 112 preferably has a peak wavelength in the wavelength range (near-infrared wavelength range) of 400 nm to 1000 nm, and more preferably, a peak wavelength in the wavelength range of 880 nm. It is noted that the absorption rate at the silicon decreases when the peak wavelength is less than 400 nm. Also, the absorption rate at another material such as quartz increases and the absorption rate at silicon decreases, when the peak wavelength exceeds 1 μm.

As the materials of the LED for light emitting element 112 having the peak wavelength in the wavelength range of 400 nm to 1000 nm, for example, AlGaAs, GaN, GaInN, AlGaInP, and ZnO may be used.

Light emitting elements 112 installed on top plate 110 are partitioned into, for example, a plurality of zones having a concentric shape and the temperature may be controlled for each zone. Therefore, a temperature gradient may be generated in a diameter direction of wafer W. For example, when there are more processing liquids and residues that should be rinsed at the periphery than the center, the temperature of the periphery of wafer W is increased, that is, the distribution of activity of rinsing liquid necessary for rinsing process in-plane of wafer W may be controlled, for example, by increasing the temperature of the periphery of wafer W.

Control unit 200 has a process controller 201 constituted by a microprocessor (computer) and each constituent member of liquid processing apparatus 10 is controlled by connecting to processor controller 201. Process controller 201 is connected with a user interface 202 constituted by a keyboard for a process manager to input a command in order to manage each constituent member of liquid processing apparatus 10 or a display for visualizing and displaying an operation status of each constituent member of liquid processing apparatus 10. Process controller 201 is connected with a storage unit 203 that stores a control program for executing various processes executed in liquid processing apparatus 10 by using the control of process controller 201 or a control program for executing a predetermined process in each constituent member of liquid processing apparatus 10 according to a processing condition, that is, a recipe. The recipe is stored in a storage medium (recording medium) of storage unit 203. The storage medium may be a hard disk or a semiconductor memory. The recipe may be appropriately transmitted from other apparatuses, for example, through an exclusive communication line.

As necessary, a predetermined recipe is called from storage 203 to be executed in process controller 201 by a command from user interface 202, such that a desired processing is performed in liquid processing apparatus 10 by controlling each member including the LEDs under the control of process controller 201.

Next, referring to FIGS. 4 to 6, a liquid processing method performed using liquid processing unit 22 by control unit 200 will be described. Hereinafter, a case using an LED is described as an example, but various types of light emitting elements may be used in addition to the LED.

Figure 4:
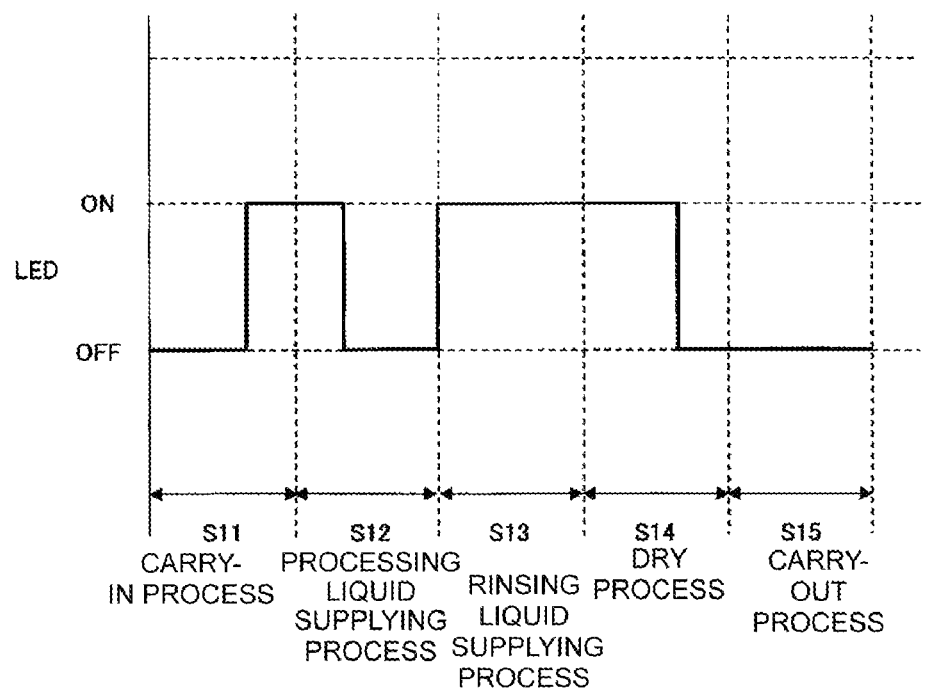
FIG. 4 is a timing chart illustrating a lighting state of an LED in each process in a liquid processing method according to the first exemplary embodiment.

FIG. 4 is a timing chart illustrating a lighting state of an LED in each process in a liquid processing method according to an exemplary embodiment. In FIG. 4, a state in which the LED is lighted up is represented by ON and a state in which the LED is lighted out is represented by OFF. FIGS. 5 and 6 are cross-sectional views schematically illustrating the state of the surface of the wafer in each process in the liquid processing method according to the exemplary embodiment.

Figure 5:
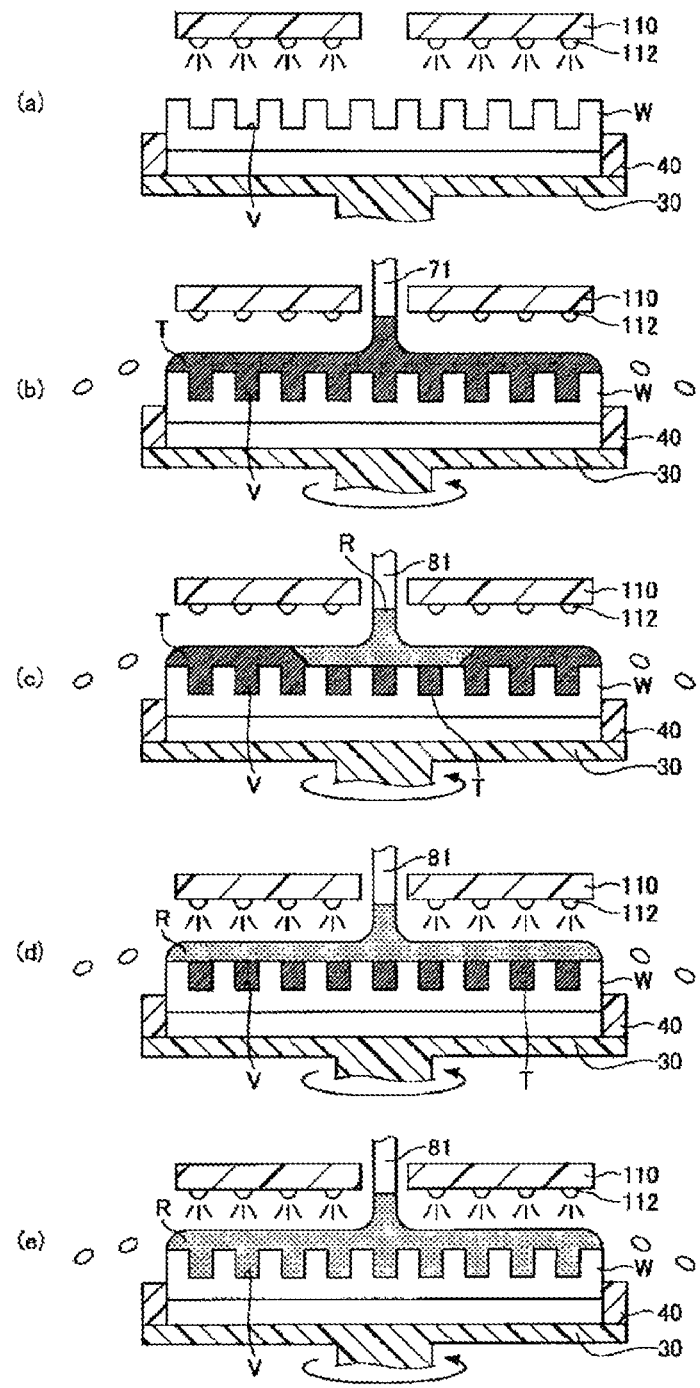
FIG. 5 is a cross-sectional view (1) schematically illustrating the state of the surface of a wafer in each process in the liquid processing method according to the first exemplary embodiment.
Figure 6:
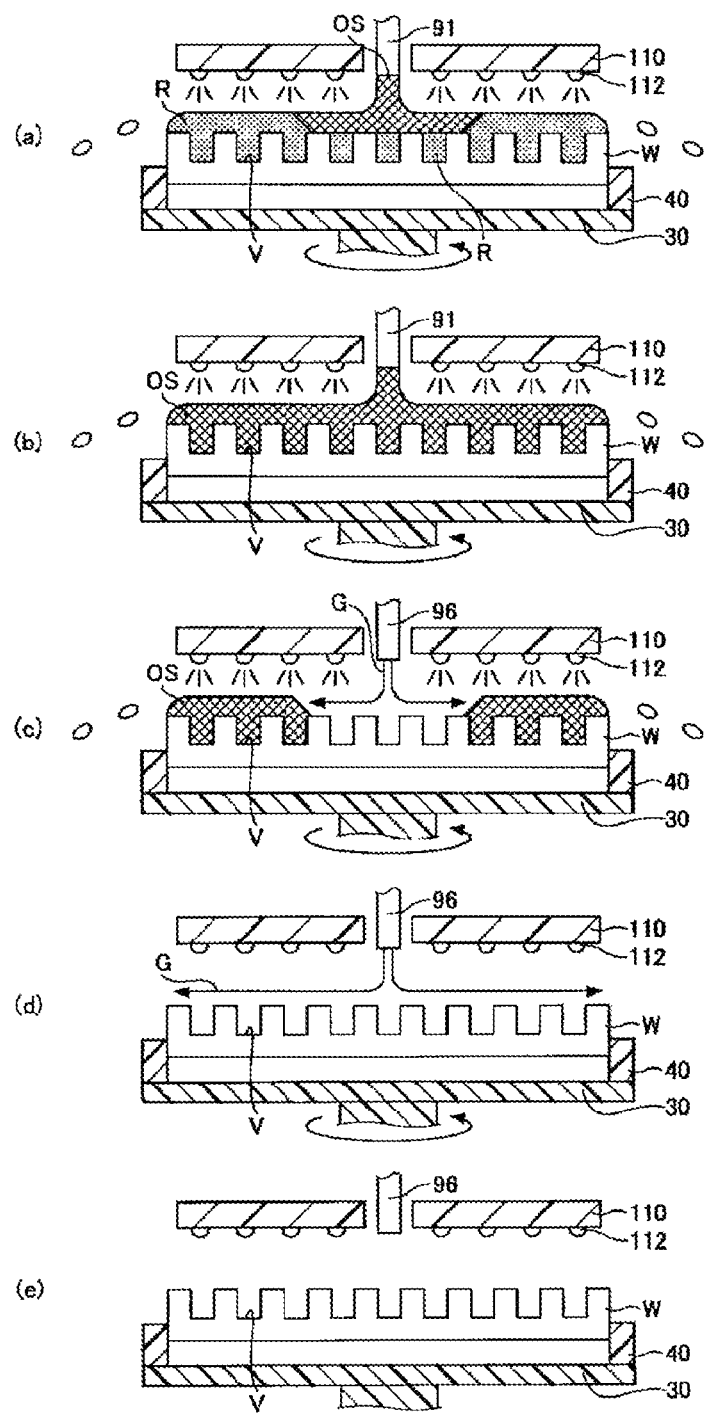
FIG. 6 is a cross-sectional view (2) schematically illustrating the state of the surface of the wafer in each process in the liquid processing method according to the first exemplary embodiment.

In FIGS. 5 and 6, a cross section of wafer W is expressed by only an outline in order to facilitate illustration.

First, at step S11 (a carry-in process), one wafer W is taken out from a wafer carrier C placed in a carrier placing unit 11 of a carry-in/out station 1 by a transportation mechanism 15 to be placed in a placing section of a delivery rack 20, and this operation is consecutively performed. Wafers W placed in the placing sections of delivery rack 20 are sequentially transported by a transportation mechanism 24 of a processing station 2 to be carried into any one of liquid processing units 22. In liquid processing units 22, wafer W is delivered to a lift pin plate 61 to move down and is held by a holding member 40.

In the next step S12 (a processing liquid supplying process), when a processing liquid having a higher temperature than room temperature is used, LEDs 112 are lighted up to irradiate light of a wavelength range emitted by LEDs 112 and absorbed only by wafer W to wafer W held by holding member 40 (FIG. 5A). Therefore, wafer W is pre-heated before supplying the processing liquid to wafer W. A temperature to heat wafer W may be, for example, in the range of 80° C. to 200° C.

Meanwhile, wafer W may be pre-heated only when the processing liquid having the higher temperature than room temperature, such as SC1 or SPM is supplied. By pre-heating wafer W using LEDs 112, the temperature of the processing liquid can be prevented from being decreased when supplying the processing liquid. LEDs 112 may heat only wafer W without influencing other members than wafer W.

At the time of performing so-called SPM cleaning process of removing a resist film by supplying to a substrate a processing liquid produced by mixing sulfuric acid and hydrogen peroxide water, cleaning, that is, peeling of the resist film may be performed within a short time by pre-heating wafer W. Meanwhile, when wafer W is not pre-heated, the temperature of wafer W increases from room temperature, and as a result, wafer W may not be processed at high temperature from an initial stage of the SPM cleaning, and cleaning becomes insufficient with only a short-time processing without pre-heating.

Subsequently, at step S12 (the processing liquid supplying process), a processing liquid T is supplied to rotating wafer W by a processing liquid supply nozzle 71 while rotating wafer W held by holding member 40 (FIG. 5B).

A rotation plate 30 is rotated by a rotation driver 50 to rotate wafer W held by holding member 40. For example, processing liquid T such as DHF or SC1 is supplied to rotating wafer W by processing liquid supply nozzle 71. The rotational speed of wafer W may be, for example, 1000 rpm.

For example, when a hole portion V is formed in wafer W, processing liquid T is filled in hole portion V by supplying processing liquid T to wafer W. Hereinafter, the case in which hole portion V is formed in wafer W is described as an example, but it is the same even when a pattern constituted by the resist film is formed in wafer W instead of hole portion V.

Even at step S12 (the processing liquid supplying process), as necessary, the LEDs are lighted up subsequently to step S11 (the carry-in process) and light emitted by the LEDs are irradiated to wafer W to heat wafer W. FIG. 4 shows an example in which the LEDs are lighted up for a predetermined time, and thereafter, the LEDs are lighted out at step S12, subsequently to step S11.

As described above, when LEDs 112 installed on a top plate 110 are partitioned into, for example, a plurality of zones having a concentric shape and the temperature is controlled for each zone, the temperature of the periphery may be controlled to be higher than the temperature of the center at a first stage of the processing using the processing liquid. Therefore, the temperature can be prevented from being decreased when the processing liquid contacts wafer W, and the temperature of the processing liquid can be prevented from being decreased while the processing liquid flows toward the periphery.

When wafer W is continuously heated by the LEDs, the temperature of wafer W becomes uniform at both the center and the periphery by, for example, a heat conduction. When the temperature of wafer W becomes uniform at both the center and the periphery, the zone control of LEDs 112 may be stopped.

Continuously, at step S13 (a rinsing liquid supplying process), for example, rinsing liquid R such as deionized water is supplied to wafer W to which processing liquid T is supplied by a rinsing liquid supply nozzle 81 (FIG. 5C). While rinsing liquid R is being supplied, the light of the wavelength range emitted by LEDs 112 and absorbed only by wafer W is irradiated to wafer W (FIG. 5D). Therefore, only wafer W may be directly heated, i.e., without directly heating the processing liquid and the rinsing liquid. A temperature to heat wafer W may be, for example, 80° C. Therefore, as described below, in the rinsing liquid supplying process, convection is generated due to the difference in temperature between the processing liquid in hole portion V, which is heated by the LEDs and the rinsing liquid that flows on the surface of the wafer, such that the processing liquid in hole portion V is easily substituted with the rinsing liquid (FIG. 5E).

Until the processing liquid on wafer W is discharged to some degree by supplying rinsing liquid R to the surface of the wafer for a predetermined time, light is not irradiated by LEDs 112 (FIG. 5C). Further, after processing liquid T is removed from the surface of the wafer to some degree, light irradiation by LEDs 112 is started (FIG. 5D). The reason therefore is that the processing using the processing liquid is progressed or an in-plane processing state in wafer W using the processing liquid is not uniform when the temperature of wafer W increases while the rinsing liquid is not removed and the processing liquid is supplied.

In the rinsing liquid supplying process, the rotational speed of wafer W while the light is irradiated by the LEDs may be, at least, lower than that of wafer W in the processing liquid supplying process.

At step S13 (the rinsing liquid supplying process), as described above, LEDs 112 installed on top plate 110 are partitioned into, for example, the plurality of zones having the concentric shape and the temperature may be controlled for each zone. Therefore, when heat convection can be generated even in a diameter direction on the surface of the wafer by generating a temperature gradient in the diameter direction of wafer W, larger heat movement may be achieved at an interface between wafer W and the rinsing liquid, and the processing liquid and the rinsing liquid may be easily substituted with each other.

Subsequently, at step S14 (a dry process), an organic solvent OS such as IPA or HFE is supplied to wafer W to which the rinsing liquid was supplied by using an organic solvent supply nozzle 91 while wafer W is rotated (FIG. 6A). As described above, organic solvent OS has smaller surface tension than that of the rinsing liquid. While organic solvent OS is supplied, the light of the wavelength range emitted by the LED and absorbed only by wafer W is irradiated to wafer W (FIG. 6B). Therefore, only wafer W may be directly heated, i.e., without directly heating the organic solvent. By the supplied organic solvent, the rinsing liquid is discharged and removed from wafer W.

During the dry process, wafer W is heated by lighting up LEDs 112 for a predetermined time, and as a result, organic solvent OS becomes warm. Therefore, since the surface tension may be reduced as compared with the surface tension at room temperature, dry efficiency is improved. When a pattern is formed instead of hole portion V, the pattern can be prevented from being collapsed due to the reduction of the surface tension.

The rotational speed of wafer W may be, for example, 300 rpm. A temperature to heat wafer W may be, for example, 50° C.

In the rinsing liquid supplying process, while rinsing liquid R is supplied, the light irradiation by the LEDs is stopped to decrease the temperature of wafer W up to, for example, approximately room temperature. Thereafter, in the dry process, the light may not be irradiated by the LEDs until the rinsing liquid on the wafer surface is removed by organic solvent OS to some degree after supplying of organic solvent OS is started while the temperature of wafer W decreases.

By supplying organic solvent OS to wafer W, rinsing liquid R filled in hole portion V is substituted with organic solvent OS.

Thereafter, at step S14 (the dry process), dry gas G such as N2 is supplied to wafer W to which organic solvent OS was supplied by using a dry gas supply nozzle 96 while LEDs 112 are lighted up (FIG. 6C). Organic solvent OS is removed while LEDs 112 are lighted up. Therefore, wafer W is dried. A temperature to heat wafer W may be, for example, 50° C.

At step S14 (the dry process), the LEDs are lighted out in order to restore the temperature of wafer W to room temperature (FIG. 6D).

In this case, wafer W may be rotated to be spin-dried. The rotational speed of wafer W may be, for example, 300 rpm.

As wafer W is dried, the inside of hole portion V is also dried.

Subsequently, at step S15 (a carry-out process), a motor 53 of a rotation driver 50 stops and wafer W held by holding member 40 also stops being rotated (FIG. 6E). Top plate 110 is positioned above a delivery position of wafer W by an elevation mechanism 120. Thereafter, a lift pin plate 61 is moved to the above position by a cylinder mechanism 62a and wafer W is thus lifted to the delivery position (upper position). Wafer W is carried out from liquid processing unit 22 by transportation mechanism 24, placed on delivery rack 20 of a delivery stage 19, and restored from delivery rack 20 to wafer carrier C by transportation mechanism 15.

Processing one wafer W is completed by a series of processes described above.

Next, referring to FIG. 7, in the exemplary embodiment, a functional effect will be described in which the processing liquid can be prevented from being remained on the substrate when the substrate is rinsed after the substrate is processed by the processing liquid to shorten a processing time, as compared with a comparative example. The case where the light emitted by the light emitting element is not irradiated is set as the comparative example.

Figure 7:
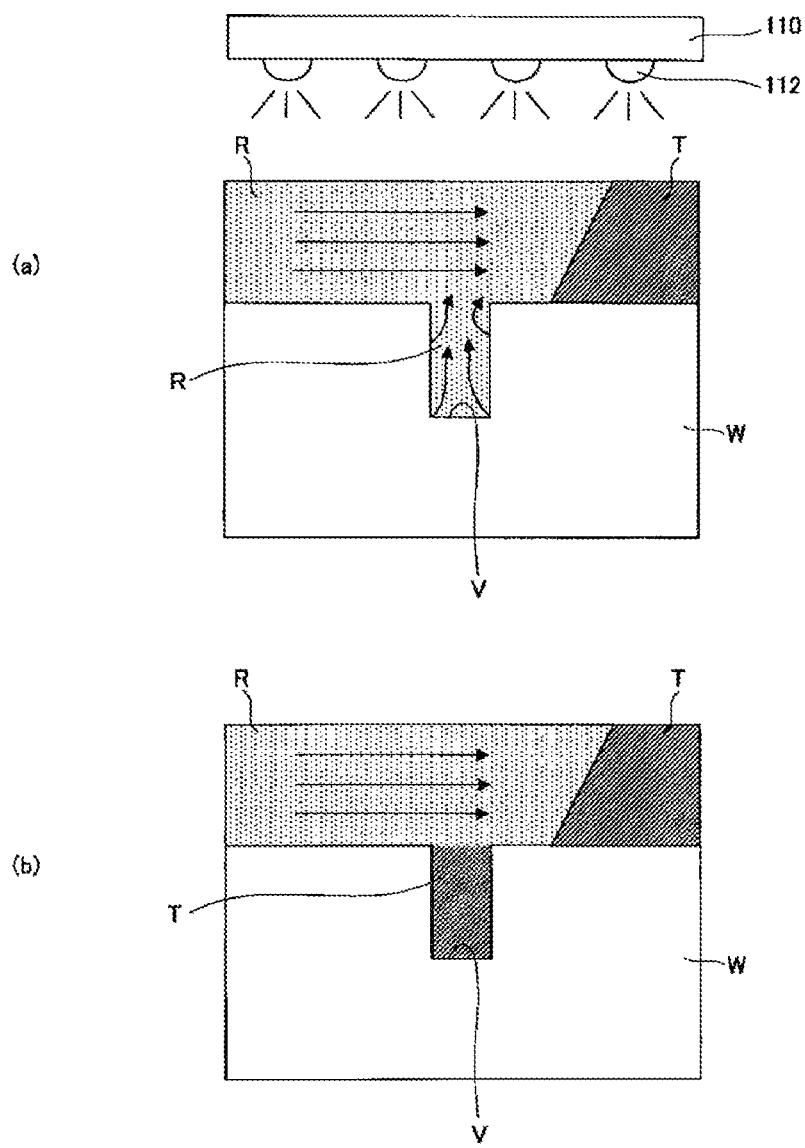
FIG. 7 is a cross-sectional view schematically illustrating the states of a processing liquid and rinsing liquid on the surface of the wafer in a rinsing liquid supplying process.

FIG. 7 is a cross-sectional view schematically illustrating the states of a processing liquid and a rinsing liquid on the surface of the wafer in a rinsing liquid supplying process. FIG. 7A shows the exemplary embodiment and FIG. 7B shows the comparative example.

The time $\tau$ required to diffuse a liquid is in inverse proportion to a diffusion coefficient D as expressed by $$\tau \sim 2 \times L^2/D \quad (1)$$

where,

L: Predetermined number determined by the shape of the hole portion

D: Diffusion coefficient.

The diffusion coefficient $D_{AB}$ of solute A to solvent B is in proportion to an absolute temperature T as described the Wilke-Chang Equation expressed by $$D_{AB} = 7.4 \times 10^{-8} \times (\Psi_B M_B)^{0.5} \times T/(\mu \times V_A^{0.6}) \quad (2)$$

where, $\Psi_B$: Association degree of solvent B $M_B$: Molecular weight of solvent B T: Absolute temperature $\mu$: Viscosity of solvent B VA: Molecular capacity of solute A at standard boiling point.

As described in the above example, the diffusion coefficient D of the liquid increases and the time $\tau$ required to diffuse the liquid decreases as the temperature increases.

For example, as shown in page II-61 of Basic Edition of Chemical Handbook II (published by MARUZEN Co., Ltd. and compiled by the Chemical Society of Japan on Sep. 30, 1993), the diffusion coefficient ($6.517 \times 10^{-9} (m^2/s)$) of deionized water at 80° C. is larger than the diffusion coefficient ($2.275 \times 10^{-9} (m^2/s)$) of deionized water at 25° C., which is consistent with an empirical result.

In a liquid processing method according to the Comparative Example, as shown in FIG. 7B, in the rinsing liquid supplying process, the light emitted by the light emitting element is not irradiated to wafer W. As a result, wafer W is not heated, such that the temperature of processing liquid T that remains in hole portion V and the temperature of rinsing liquid R forming a liquid film on the wafer surface are relatively low. Accordingly, the diffusion coefficient D in which processing liquid T remaining in hole portion V and rinsing liquid R forming the liquid film on the wafer surface are diffused to each other is relatively small and the time τ required for diffusion is relatively long. As a result, processing liquid T remaining in hole portion V is not easily mixed with rinsing liquid R on the wafer surface.

Meanwhile, in the present exemplary embodiment, as shown in FIG. 7A, in the rinsing liquid supplying process, the light emitted by light emitting elements 112 is irradiated to wafer W to heat wafer W. As a result, the temperature of processing liquid T remaining in hole portion V becomes relatively higher. Therefore, the diffusion coefficient D in which processing liquid T remaining in hole portion V is diffused is relatively large and the time τ required for diffusion is relatively short. As a result, processing liquid T remaining in hole portion V is easily mixed with rinsing liquid R on the wafer surface.

As an example, when wafer W is heated to 80° C., the time τ required for diffusion is approximately ⅓ of that required for the case where wafer W is not heated.

In the exemplary embodiment, when wafer W is heated, the temperature of processing liquid T remaining in hole portion V increases, and as a result, the difference in temperature from rinsing liquid is generated to cause convection (FIG. 7A). By the convection of processing liquid T, a mixed liquid of processing liquid T and rinsing liquid R remaining in hole portion V is easily substituted with rinsing liquid R on the wafer surface.

When the LED is used as the light emitting element, the temperature of wafer W may be rapidly increased after lighting up the LED. Accordingly, the temperature of wafer W can be precisely controlled and a lighting time can be shortened. Luminous efficiency is also high. As a result, power consumption required to heat wafer W can be reduced.

Since the light emitting element emits the light of the wavelength range absorbed only by wafer W, the temperatures of adjacent members can be prevented from being increased.

As described above, according to the exemplary embodiment, at least in the rinsing liquid supplying process, the light of the wavelength range emitted by the light emitting elements and absorbed only by the substrate is irradiated to the substrate to heat the substrate. When the substrate is heated, the temperature of the remaining processing liquid increases, and as a result, the diffusion coefficient in which the processing liquid is diffused is increased to easily mix the processing liquid and the rinsing liquid that remain. Convection is generated due to the difference in temperature between the heated processing liquid and the rinsing liquid that flows on the surface of wafer W, such that a mixed liquid of the processing liquid and the rinsing liquid in the hole portion or the pattern is easily substituted with the rinsing liquid. Therefore, when the substrate is rinsed after the processing using the processing liquid, the processing liquid can be prevented from being remained on the substrate to shorten the processing time.

First Modified Example of First Exemplary Embodiment

Next, referring to FIG. 8, a liquid processing method according to a first modified example of the first exemplary embodiment of the present disclosure will be described.

The liquid processing method according to the modified example is different from the liquid processing method according to the first exemplary embodiment, in that the LEDs are not lighted up in the carry-in process and the processing liquid supplying process. Therefore, since a liquid processing apparatus for executing the liquid processing method according to the modified example may be the same as the liquid processing apparatus according to the first exemplary embodiment, a description thereof will be omitted.

Figure 8:
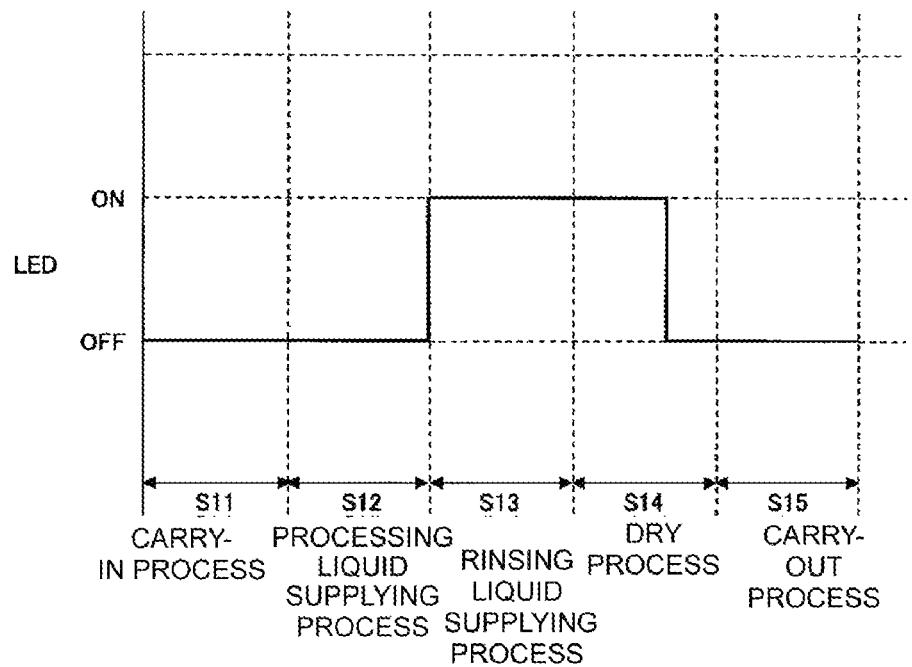
FIG. 8 is a timing chart illustrating a lighting state of an LED in each process in a liquid processing method according to a first modified example of the first exemplary embodiment.

FIG. 8 is a timing chart illustrating a lighting state of the LED in each process in the liquid processing method according to the modified example.

In the modified example, similar to the first exemplary embodiment, step S11 (the carry-in process) is performed first, and then, steps S12 (the processing liquid supplying process) to S14 (the dry process) are performed to perform the processing using the processing liquid, rinsing and drying. Thereafter, step S15 (the carry-out process) is performed similar to the first exemplary embodiment. However, in the modified example, the LEDs are not lighted up at steps S11 (the carry-in process) and S12 (the processing liquid supplying process).

In the modified example, at least in the rinsing liquid supplying process, the light of the wavelength range emitted by the light emitting elements and absorbed only by the substrate is irradiated to the substrate to heat the substrate. When the substrate is heated, the temperature of the remaining processing liquid is increased, and as a result, the diffusion coefficient in which the processing liquid is diffused is increased to easily mix the processing liquid that remains and the rinsing liquid. Convection is generated due to the difference in temperature between the heated processing liquid and the rinsing liquid that flows on the surface of wafer W, such that a mixed liquid of the processing liquid and the rinsing liquid in the hole portion or the pattern is easily substituted with the rinsing liquid. Therefore, when the substrate is rinsed after the processing using the processing liquid is performed, the processing liquid can be prevented from being remained on the substrate to shorten the processing time.

Second Modified Example of First Exemplary Embodiment

Next, referring to FIGS. 9 and 10, a liquid processing method according to a second modified example of the first exemplary embodiment of the present disclosure will be described.

The liquid processing method according to the modified example is different from the liquid processing method according to the first exemplary embodiment, in that the LEDs are not lighted up in the carry-in process and the processing liquid supplying process, and the organic solvent is not supplied in the dry process. Therefore, since the liquid processing apparatus for executing the liquid processing method according to the modified example may be the same as the liquid processing apparatus according to the first exemplary embodiment, a description thereof will be omitted. However, in the modified example, the liquid processing apparatus may not include the organic solvent supply mechanism 90.

Figure 9:
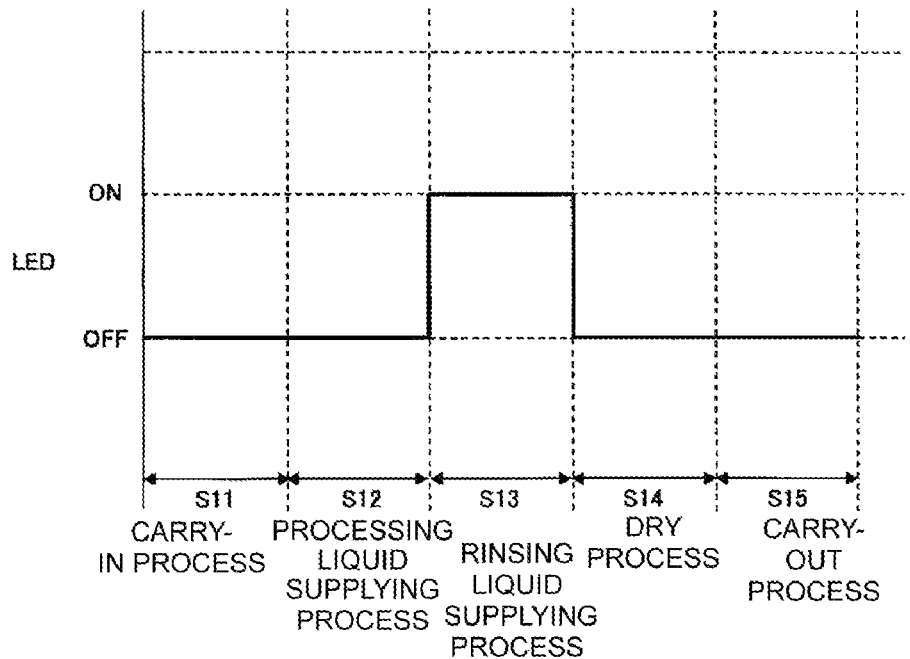
FIG. 9 is a timing chart illustrating a lighting state of an LED in each process in a liquid processing method according to a second modified example of the first exemplary embodiment.

FIG. 9 is a timing chart illustrating a lighting state of the LED in each process in the liquid processing method according to the modified example. FIG. 10 is a cross-sectional view schematically illustrating the state of the surface of the wafer in each process in the liquid processing method according to the modified example.

Figure 10:
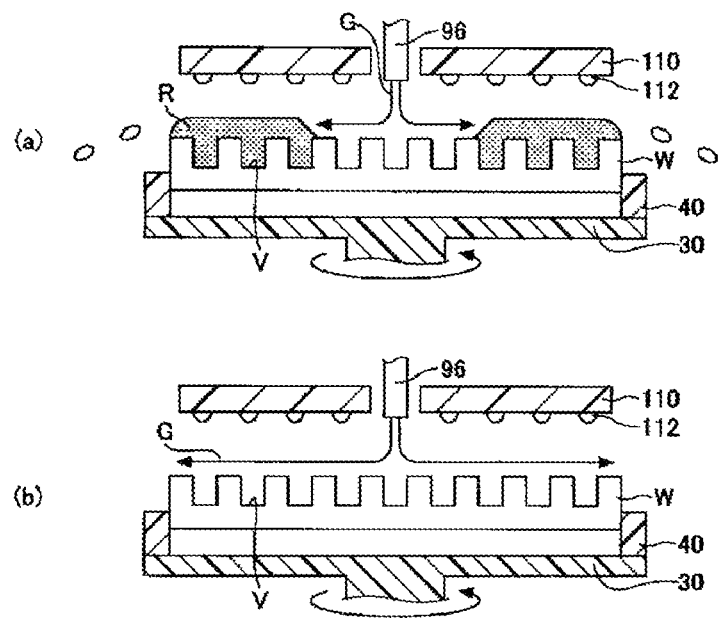
FIG. 10 is a cross-sectional view schematically illustrating the state of the surface of the wafer in each process in the liquid processing method according to the second modified example of the first exemplary embodiment.

In FIG. 10, a cross section of wafer W is expressed by only an outline in order to facilitate illustration.

In the modified example, step S11 (the carry-in process) is performed first, and then, steps S12 (the processing liquid supplying process) to S14 (the dry process) are performed to perform the processing using the processing liquid, rinsing and drying, similar to the first exemplary embodiment. Thereafter, step S15 (the carry-out process) is performed similar to the first exemplary embodiment. However, in the modified example, at step S14 (the dry process), the organic solvent is not supplied and the LEDs are not lighted up either.

At step S14 (the dry process), dry gas G such as $N_2$ gas is supplied to wafer W to which rinsing liquid R was supplied by using a dry gas supply nozzle 96 while LEDs 112 are lighted out (FIG. 10A). While LEDs 112 are lighted out, rinsing liquid R is removed and wafer W is dried (FIG. 10B).

In this case, wafer W may be rotated to be spin-dried. The rotational speed of wafer W may be, for example, 1000 rpm.

The dry gas may be supplied while the LEDs are lighted out. Therefore, a watermark can be prevented from being generated on the wafer surface as the rinsing liquid evaporates in the drying process.

As wafer W is dried, the inside of hole portion V is also dried.

Even in the modified example, at least in the rinsing liquid supplying process, the light of the wavelength range emitted by the light emitting elements and absorbed only by the substrate is irradiated to the substrate to heat the substrate. When the substrate is heated, the temperature of the remaining processing liquid increases, and as a result, the diffusion coefficient in which the processing liquid is diffused is increased to easily mix the processing liquid that remains and the rinsing liquid. Convection is generated due to the difference in temperature between the heated processing liquid and the rinsing liquid that flows on the surface of wafer W, such that a mixed liquid of the processing liquid and the rinsing liquid in the hole portion or the pattern is easily substituted with the rinsing liquid. Therefore, when the substrate is rinsed after the processing using the processing liquid, the processing liquid can be prevented from being remained on the substrate to shorten the processing time.

Second Exemplary Embodiment

First, referring to FIG. 11, a schematic configuration of a liquid processing apparatus according to a second exemplary embodiment of the present disclosure will be described.

The liquid processing apparatus according to the exemplary embodiment is different from the liquid processing apparatus according to the first exemplary embodiment, in that the light emitting elements are installed below the wafer in the liquid processing unit. Parts other than the liquid processing unit of the liquid processing apparatus according to the exemplary embodiment have the same structure as the liquid processing apparatus according to the first exemplary embodiment, and a description thereof will be omitted.

Figure 11:
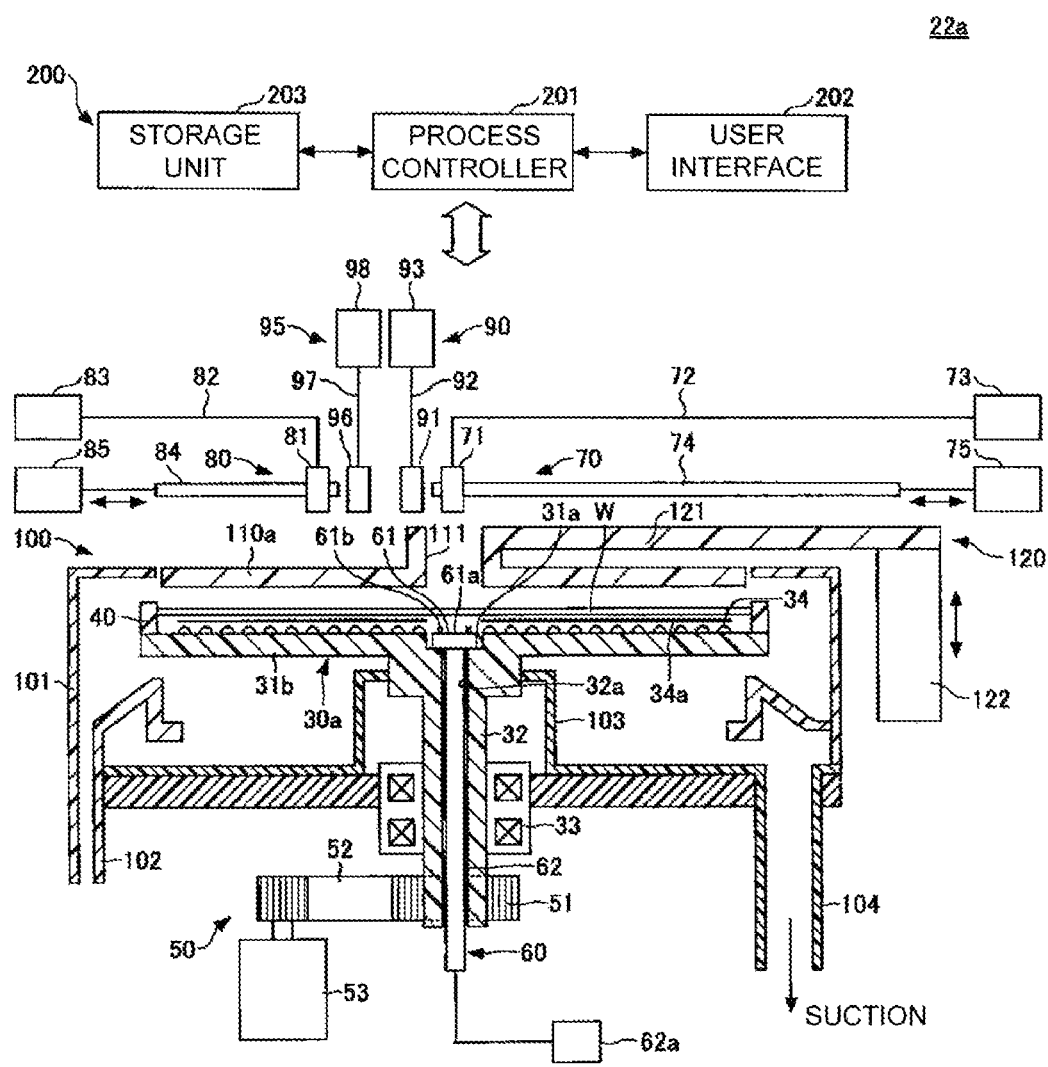
FIG. 11 is a cross-sectional view illustrating a schematic configuration of a liquid processing unit according to a second exemplary embodiment.

FIG. 11 is a cross-sectional view illustrating a schematic configuration of a liquid processing unit 22a according to the exemplary embodiment.

Liquid processing unit 22a includes a rotation plate 30a, a holding member 40, a rotation driver 50, a substrate elevating member 60, a processing liquid supply mechanism 70, a rinsing liquid supply mechanism 80, an organic solvent supply mechanism 90, a dry gas supply mechanism 95, an exhaust/drainage unit (cup) 100, a top plate 110a, an elevation mechanism 120, and a controller 200. The parts other than rotation plate 30a and top plate 110a have the same structure as liquid processing unit 22 according to the first exemplary embodiment and a description thereof will be omitted.

Rotation plate 30a includes a base plate 31a and a rotational shaft 32. The second exemplary embodiment is the same as the first exemplary embodiment, in that base plate 31b is horizontally installed and has the circular hole 31a formed at the center thereof and rotational shaft 32 is installed to extend downward from base plate 31b and has the cylindrical shape having the hole 32a formed at the center thereof.

Light emitting elements 34 are installed on the top surface of base plate 31b. Light emitting elements 34 emit light of a wavelength range which only wafer W absorbs and irradiate the emitted light to wafer W. Similarly as shown in FIGS. 2 and 3 in the first exemplary embodiment, light emitting elements 34 may be arranged on the top surface of base plate 31b, for example, substantially without a gap at regular intervals.

A cover 34a made of, for example, quartz may be installed above light emitting elements 34. Cover 34a is used to protect light emitting elements 34 from the processing liquid.

As light emitting elements 34, for example, a plurality of light emitting diodes (LEDs) or a plurality of semiconductor lasers may be used similar to light emitting elements 112 of the first exemplary embodiment. Since light emitted by the light emitting diode (LED) or the semiconductor laser has a peak wavelength in a predetermined wavelength range, the LED or the semiconductor laser easily emits light of a wavelength range which is not absorbed by the processing liquid or the rinsing liquid but absorbed only by wafer W.

The LEDs are used as light emitting elements 34 to shorten the time until the temperature of wafer W increases to become stable after the LEDs are lighted up (ON). The LED has excellent luminous efficiency. Accordingly, the LEDs are used as light emitting elements 34 to reduce power consumption.

Since light emitting elements 34 are installed on the top surface of base plate 31b, the light emitting elements may not be installed on the bottom surface of top plate 110a.

The liquid processing method according to the present exemplary embodiment may be the same as any one of the liquid processing methods according to the first exemplary embodiment, the liquid processing method according to the first modified example of the first exemplary embodiment, and the liquid processing method according to the second modified example of the first exemplary embodiment, except that wafer W held by holding member 40 is heated from not above top surface but below bottom surface.

Even in the exemplary embodiment, at least in the rinsing liquid supplying process, the light of the wavelength range emitted by the light emitting elements and absorbed only by the substrate is irradiated to the substrate to heat the substrate. When the substrate is heated, the temperature of the remaining processing liquid increases, and as a result, the diffusion coefficient in which the processing liquid is diffused is increased to easily mix the processing liquid that remains and the rinsing liquid. Convection is generated due to the difference in temperature between the heated processing liquid and the rinsing liquid that flows on the surface of wafer W, such that a mixed liquid of the processing liquid and the rinsing liquid in the hole portion or the pattern is easily substituted with the rinsing liquid. Therefore, when the substrate is rinsed after the processing using the processing liquid, the processing liquid can be prevented from being remained on the substrate to shorten the processing time.

As described above, although the exemplary embodiments of the present disclosure have been described, the present disclosure is not limited to the specific exemplary embodiments, however, various modifications and changes can be made within the scope and spirits of the appended claims.

For example, the exemplary embodiments of the present disclosure can be applied to the development processing as well using an alkaline developer after exposing a resist film, as the processing using the processing liquid. That is, the liquid processing method according to the present disclosure can be applied even in rinsing after the development processing. The substrate is heated by irradiating the light emitted by the light emitting elements such as the LEDs to the substrate to prevent the developer from being remained on the substrate when rinsing the substrate after the development processing, thereby shortening a time required for the development processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus that processes a substrate with a processing liquid, the liquid processing apparatus comprising:
    a substrate holder configured to hold the substrate including a surface formed with a hole portion or a pattern;
    a processing liquid supply unit configured to supply the processing liquid to the substrate held by the substrate holder;
    a rinsing liquid supply unit configured to supply a rinsing liquid to the substrate;
    a light emitting element including a plurality of LEDs disposed on an upper side of the substrate holder and configured to emit light of a wavelength range corresponding to the substrate itself, absorbed directly only by the substrate itself including the surface formed with the hole portion or the pattern and irradiate the emitted light to the substrate, the plurality of LEDs being provided with a plurality of zones having a concentric shape; and
    a control unit configured to control an overall operation of the liquid processing apparatus including the substrate holder, the processing liquid supply unit, the rinsing liquid supply unit and the light emitting element,
    wherein the control unit is programmed to select a wavelength of the light emitting element in such a way that the light emitting element emits light of the wavelength range absorbed directly only by the substrate itself including the surface formed with the hole portion or the pattern in order to directly heat the substrate first and then indirectly heat the processing liquid within the hole portion or the pattern by the heated substrate, thereby increasing a diffusion coefficient of the heated processing liquid within the hole portion or the pattern in order to easily mix the heated processing liquid within the hole portion or the pattern and the rinsing liquid supplied on the surface of the substrate from the rinsing liquid supply unit,
    wherein the control unit is further programmed to control the plurality of LEDs of the light emitting element in the plurality of zones in order to set the temperature of a periphery area of the substrate to be higher than that of a center area of the substrate during a liquid processing using the processing liquid such that the temperature of the substrate becomes uniform at both the center area and the periphery area while the processing liquid flows toward the periphery area of the substrate, and
    wherein the control unit is also programmed to control the plurality of LEDs of the light emitting element in the plurality of zones in order to set the temperature of the periphery area of the substrate to be higher than that of the center area of the substrate during at lease a period of supplying the rinsing liquid to the substrate supplied with the processing liquid thereby generating a temperature gradient in a diameter direction of the substrate when the rinsing liquid is supplied to the substrate, which also creates convection between the processing liquid within the hole portion and the rinsing liquid supplied to the substrate.

2. The liquid processing apparatus of claim 1, wherein the control unit is programmed to control the irradiation of the light from the light emitting element to begin only after supplying the rinsing liquid for a predetermined of time after stopping the irradiation of the light when supplying the rinsing liquid to the substrate.

3. The liquid processing apparatus of claim 1, wherein the substrate is a silicon substrate,
    the light emitted by the light emitting element has a peak wavelength corresponding to the silicon substrate in the wavelength range of 400 nm to 1000 nm, and
    at least one of AlGaAs, GaN, GaInN, AlGaInP, and ZnO is used as the materials of the LEDs.

4. The liquid processing apparatus of claim 1, further comprising:
    an organic solvent supply unit configured to supply an organic solvent to the substrate,
    wherein the control unit is programmed to control the organic solvent supply unit to supply the organic solvent to the substrate supplied with the rinsing liquid and control to dry the substrate after removing the rinsing liquid with the supplied organic solvent, and
    wherein the control unit is programmed to control the light emitted by the light emitting element to be irradiated to the substrate when supplying the organic solvent to the substrate.

5. The liquid processing apparatus of claim 1, wherein the control unit is programmed to control the light emitted by the light emitting element to be irradiated to the substrate before supplying the processing liquid to the substrate.

6. The liquid processing apparatus of claim 1, further comprising:
    a rotation driver configured to rotate the substrate holder,
    wherein the rotation driver is configured to rotate the substrate held by the substrate holder by rotating the substrate holder, and
    wherein the control unit is programmed to control the rotation driver such that rotational speed of the substrate holder when the processing liquid is supplied to the substrate is lower than the rotational speed of the substrate holder when the rinsing liquid is supplied to the substrate.

7. The liquid processing apparatus of claim 1, wherein the plurality LEDs are provided on the upper side of the substrate holder at regular intervals.

8. The liquid processing apparatus of claim 1 further comprising a top plate installed on an upper side of the substrate holder and configured to cover the substrate held by the substrate holder from above, and the light emitting element is provided on a bottom surface of the top plate,
    wherein the top plate has an opening portion penetrating the top plate at the center thereof, and the opening portion is used to supply, to the substrate, the processing liquid and the rinsing liquid by the processing liquid supply unit and rinsing liquid supply unit, respectively, from above of the top plate.

9. The liquid processing apparatus of claim 8, wherein the top plate is configured to be elevatable.

\* \* \* \* \*